United States Patent
Schenkl et al.

(10) Patent No.: US 10,077,935 B2
(45) Date of Patent: Sep. 18, 2018

(54) SHELF ASSEMBLY FOR A REFRIGERATOR OR FREEZER

(71) Applicant: emz-Hanauer GmbH & Co. KGaA, Nabburg (DE)

(72) Inventors: Johann Schenkl, Bodenwoehr (DE); Manfredi Signorino, Nabburg (DE); Georg Spiessl, Willhof-Altendorf (DE); Georg Wilhelm, Guteneck (DE)

(73) Assignee: emz-Hanauer GmbH & Co. KGaA, Nabburg (DE)

( * ) Notice: Subject to any disclaimer, the term of this patent is extended or adjusted under 35 U.S.C. 154(b) by 190 days.

(21) Appl. No.: 15/264,929

(22) Filed: Sep. 14, 2016

(65) Prior Publication Data

US 2017/0086322 A1    Mar. 23, 2017

(30) Foreign Application Priority Data

Sep. 22, 2015    (EP) .................................... 15002734

(51) Int. Cl.
*H05K 13/00*    (2006.01)
*F25D 25/02*    (2006.01)
(Continued)

(52) U.S. Cl.
CPC ............... *F25D 25/02* (2013.01); *F21S 4/28* (2016.01); *F21V 3/02* (2013.01); *F21V 33/0044* (2013.01);
(Continued)

(58) Field of Classification Search
CPC ............... F25D 27/00; F25D 2400/40; Y10T 29/49359; Y10T 29/49169; A47F 3/001;
(Continued)

(56) References Cited

U.S. PATENT DOCUMENTS

| | | | |
|---|---|---|---|
| 5,034,861 | A | 7/1991 | Sklenak et al. |
| 8,322,873 | B2 | 12/2012 | Glovatsky et al. |

(Continued)

FOREIGN PATENT DOCUMENTS

| | | |
|---|---|---|
| DE | 102007020882 A1 | 11/2008 |
| DE | 102009040830 A1 | 3/2011 |

(Continued)

OTHER PUBLICATIONS

European Patent Office Search Report for EPA 15002734.0/1605, dated Mar. 17, 2016.
Office Action from German Patent Office, dated Feb. 23, 2018.

*Primary Examiner* — Thiem Phan
(74) *Attorney, Agent, or Firm* — Robert R. Deleault, Esq.; Mesmer & Deleault, PLLC

(57) ABSTRACT

A shelf assembly for a refrigerator or freezer includes a receiving plate for receiving objects, a holding arrangement which is joined to the receiving plate to form a structural unit and by means of which the shelf assembly can be mounted in a cooling or freezing space of the refrigerator or freezer on delimiting walls of the cooling or freezing space, and an electrical consumer such as a lighting module. The holding arrangement has a holding element which is arranged in the region of a side edge of the receiving plate, extends along the side edge and is made at least in part of an electrically conducting metal material. The shelf assembly forms a power supply path via the metal material where the power supply path includes an electrically conducting element that extends into a cutout in the holding element and in electrically conducting contact with the holding element.

19 Claims, 8 Drawing Sheets

(51) Int. Cl.
*H05K 7/14* (2006.01)
*F25D 27/00* (2006.01)
*F21V 33/00* (2006.01)
*F21S 4/28* (2016.01)
*F21V 3/02* (2006.01)
*F25D 23/06* (2006.01)
*F21Y 115/10* (2016.01)
*F21W 131/305* (2006.01)
*A47B 96/02* (2006.01)

(52) U.S. Cl.
CPC ......... *F25D 23/062* (2013.01); *F25D 23/067* (2013.01); *F25D 27/00* (2013.01); *H05K 7/14* (2013.01); *H05K 7/1417* (2013.01); *A47B 96/02* (2013.01); *F21W 2131/305* (2013.01); *F21Y 2115/10* (2016.08); *F25D 2325/022* (2013.01); *F25D 2400/00* (2013.01); *Y10T 29/49169* (2015.01)

(58) Field of Classification Search
CPC . E05Y 2900/31; E05Y 2800/106; H05K 7/14; H05K 7/1417

USPC .................. 29/854, 428, 857, 862, 874, 876
See application file for complete search history.

(56) References Cited

U.S. PATENT DOCUMENTS

| | | | |
|---|---|---|---|
| 8,466,688 | B2 | 6/2013 | Feucht et al. |
| 8,596,205 | B2 | 12/2013 | Driver et al. |
| 8,899,704 | B2 | 12/2014 | Bienick |
| 8,967,740 | B2 * | 3/2015 | Kerner .................. H01R 43/00 312/237 |
| 9,766,010 | B2 * | 9/2017 | Katu ...................... F25D 27/00 |
| 2014/0217879 | A1 | 8/2014 | Kerner |
| 2014/0376213 | A1 | 12/2014 | Miedema et al. |
| 2015/0216062 | A1 | 7/2015 | Theisen et al. |

FOREIGN PATENT DOCUMENTS

| | | | |
|---|---|---|---|
| WO | 2014205352 | A1 | 12/2014 |
| WO | 2014205353 | A1 | 12/2014 |

\* cited by examiner

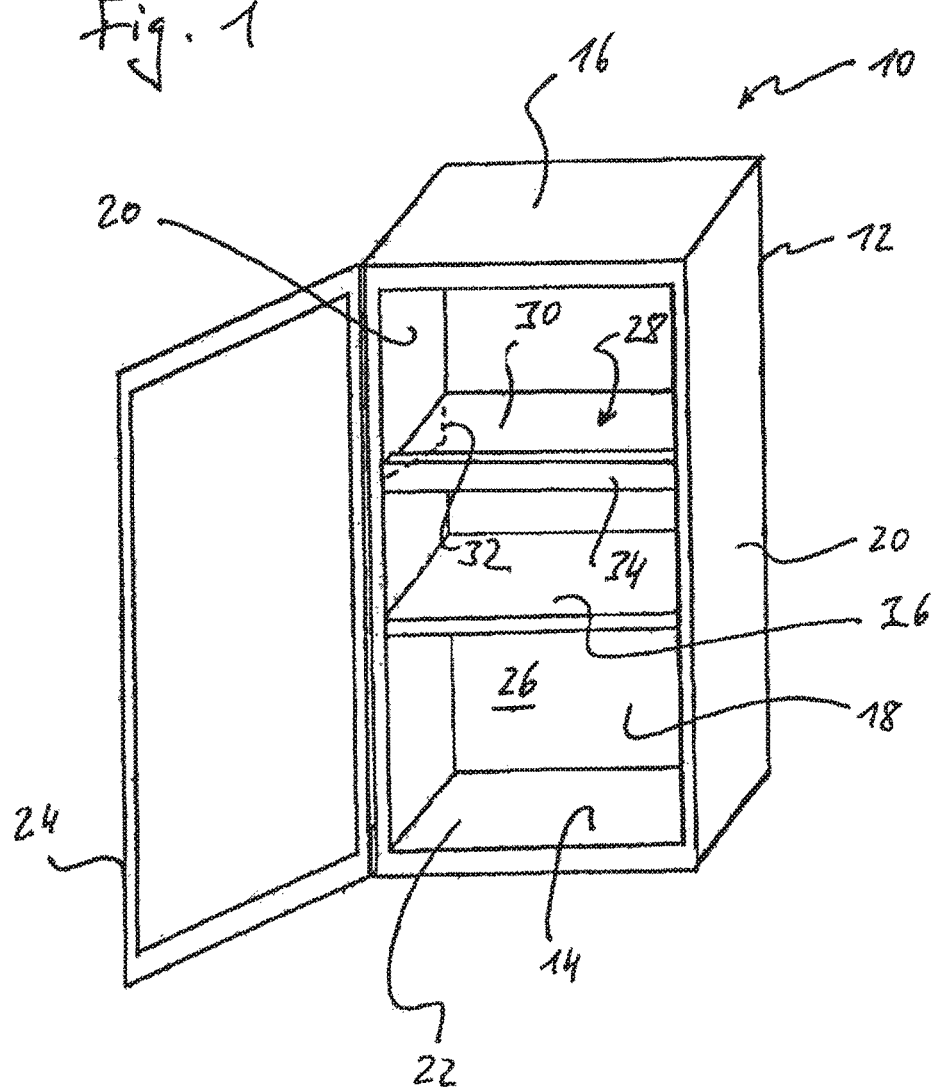

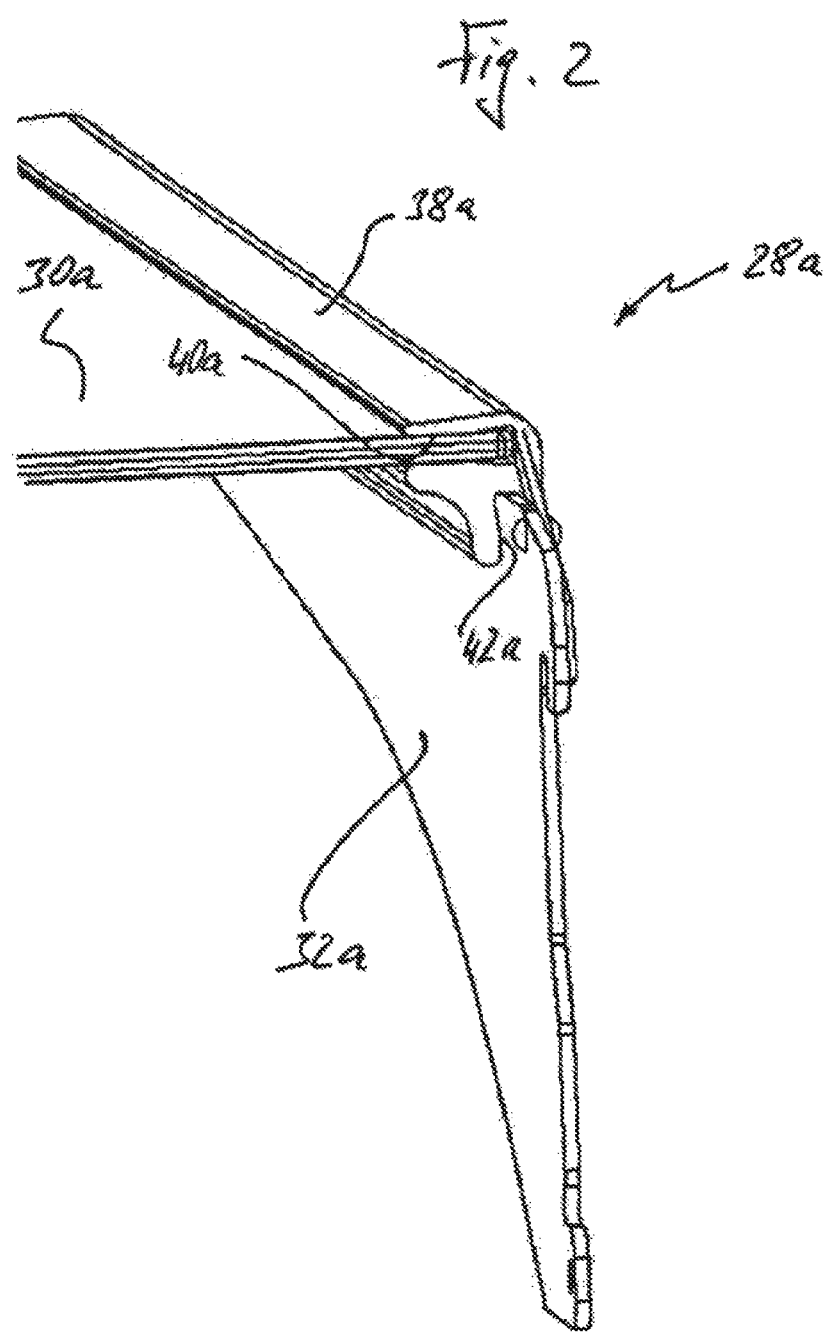

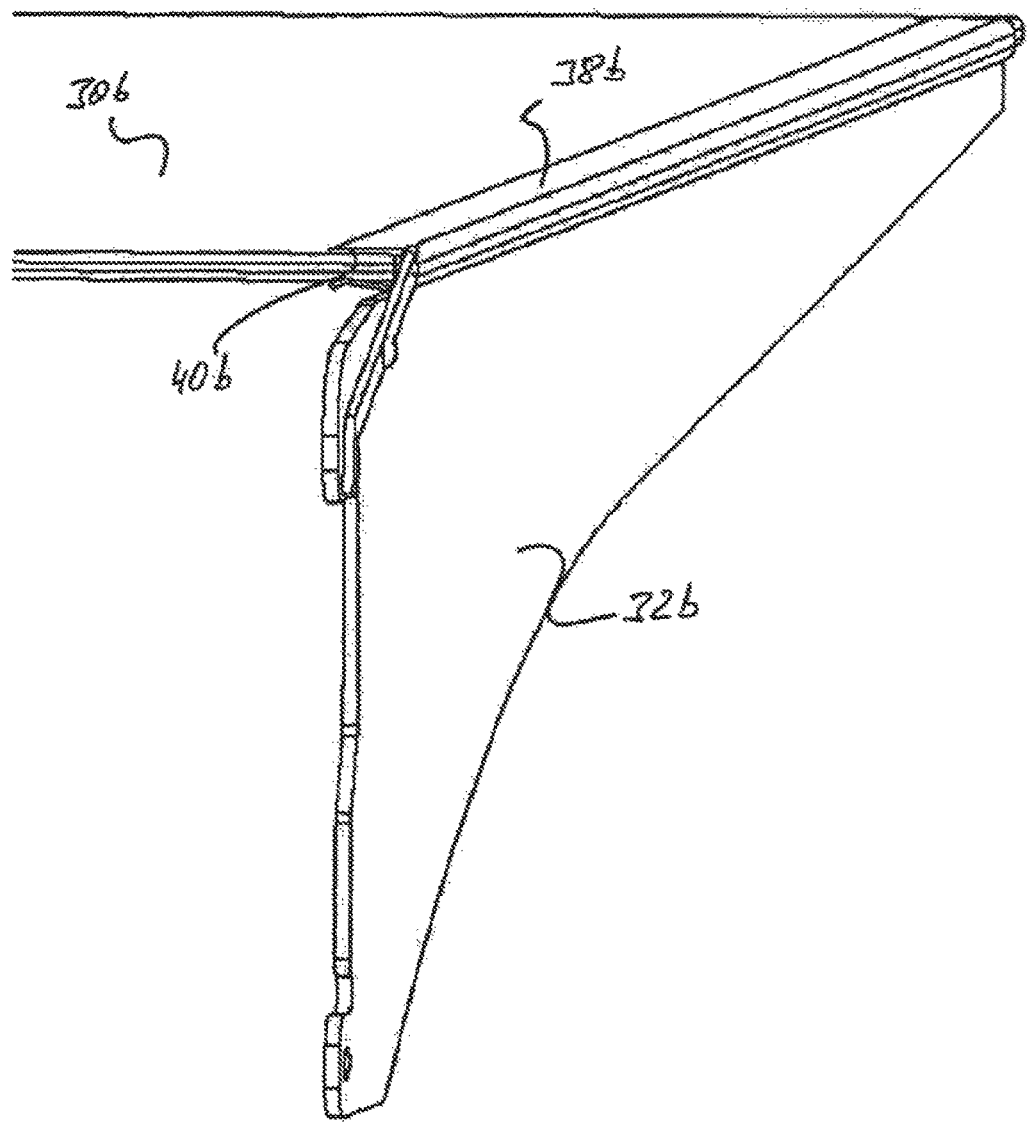

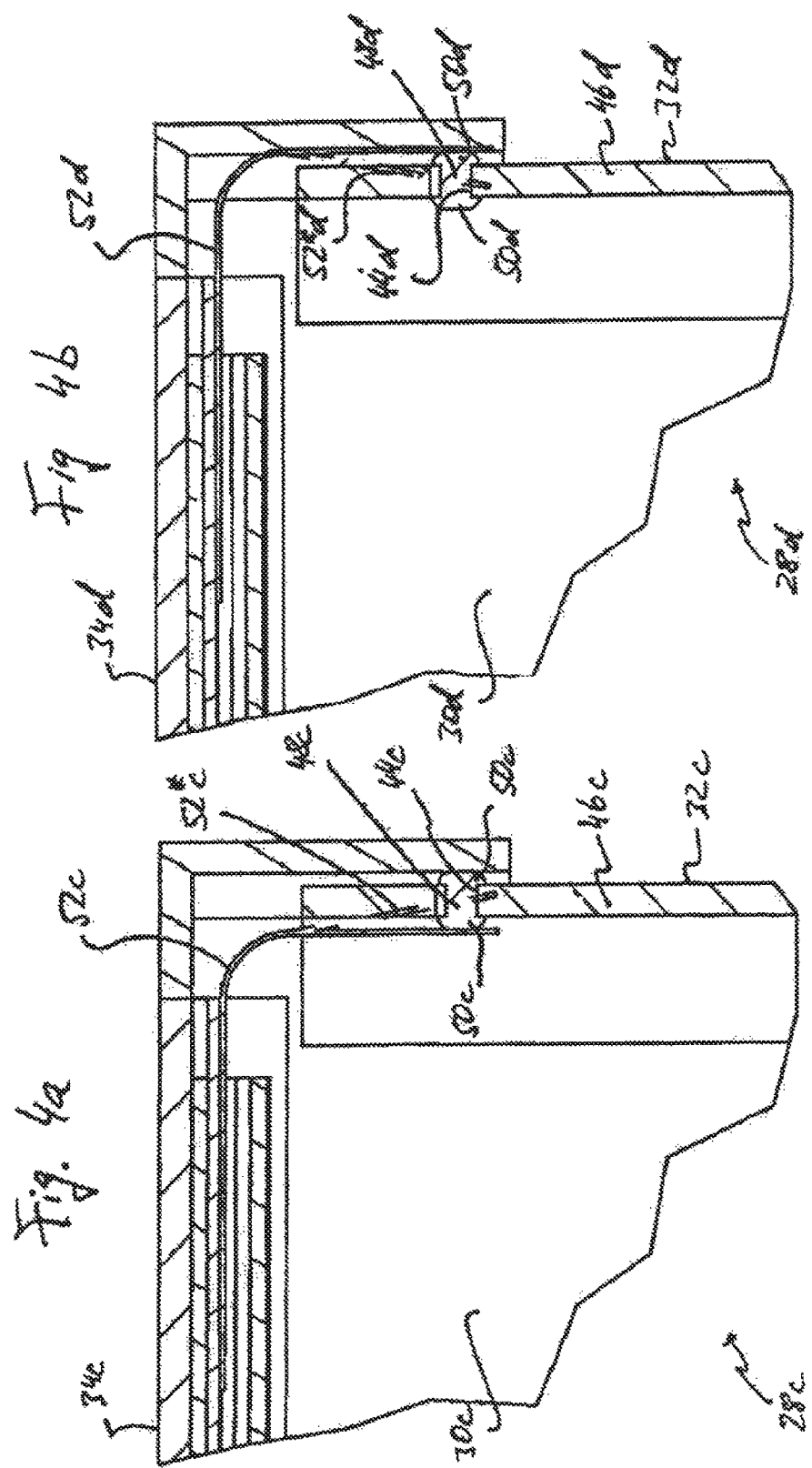

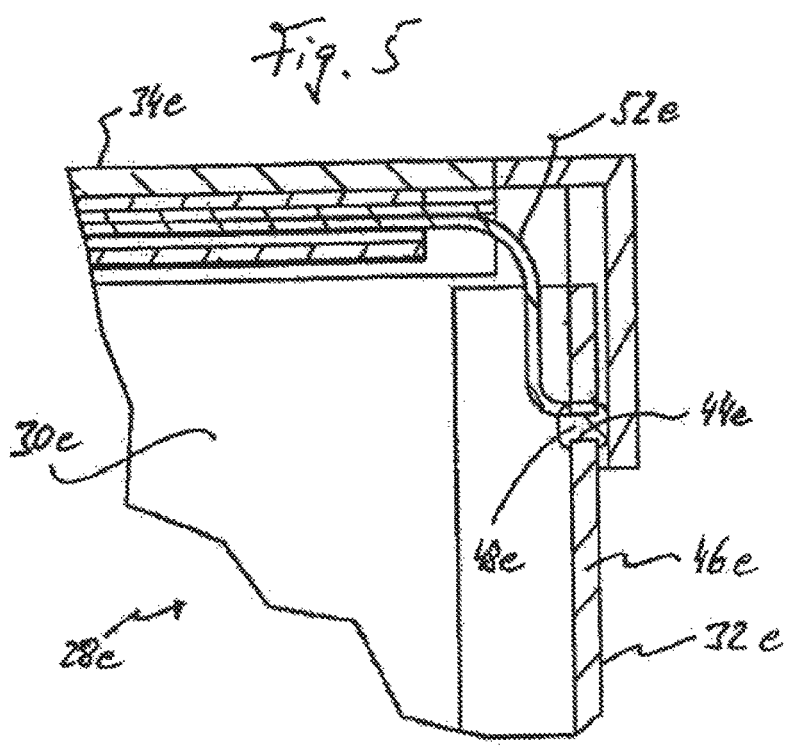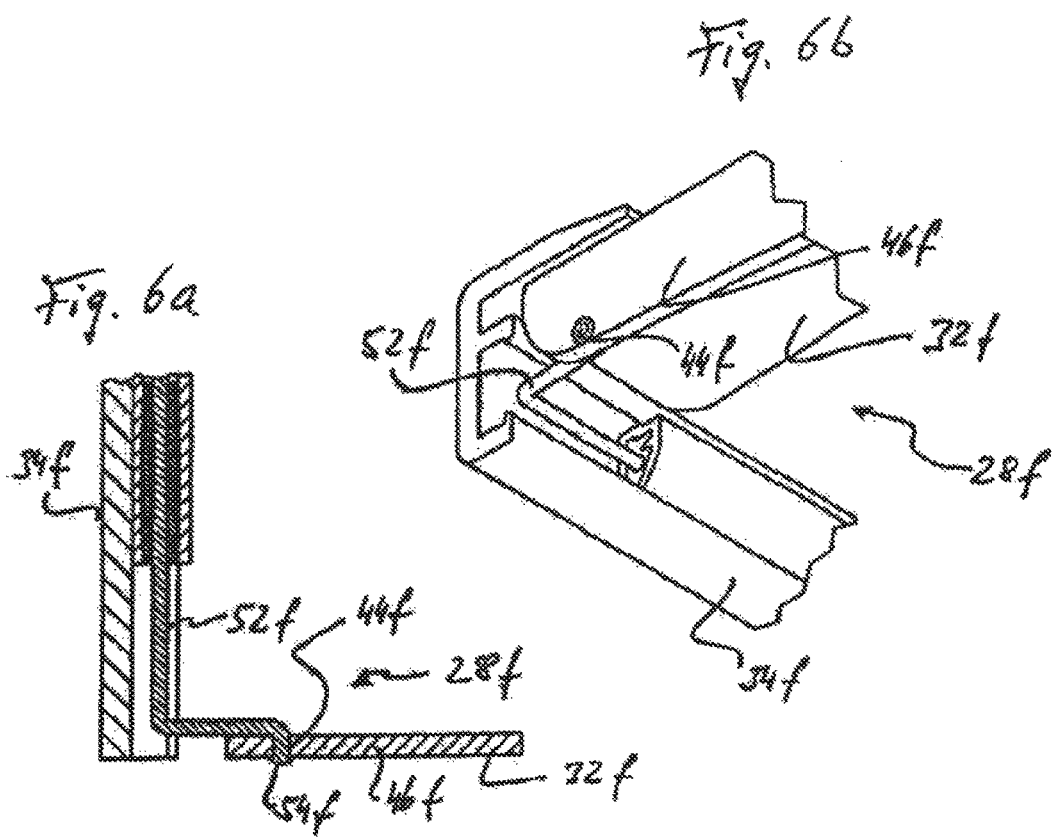

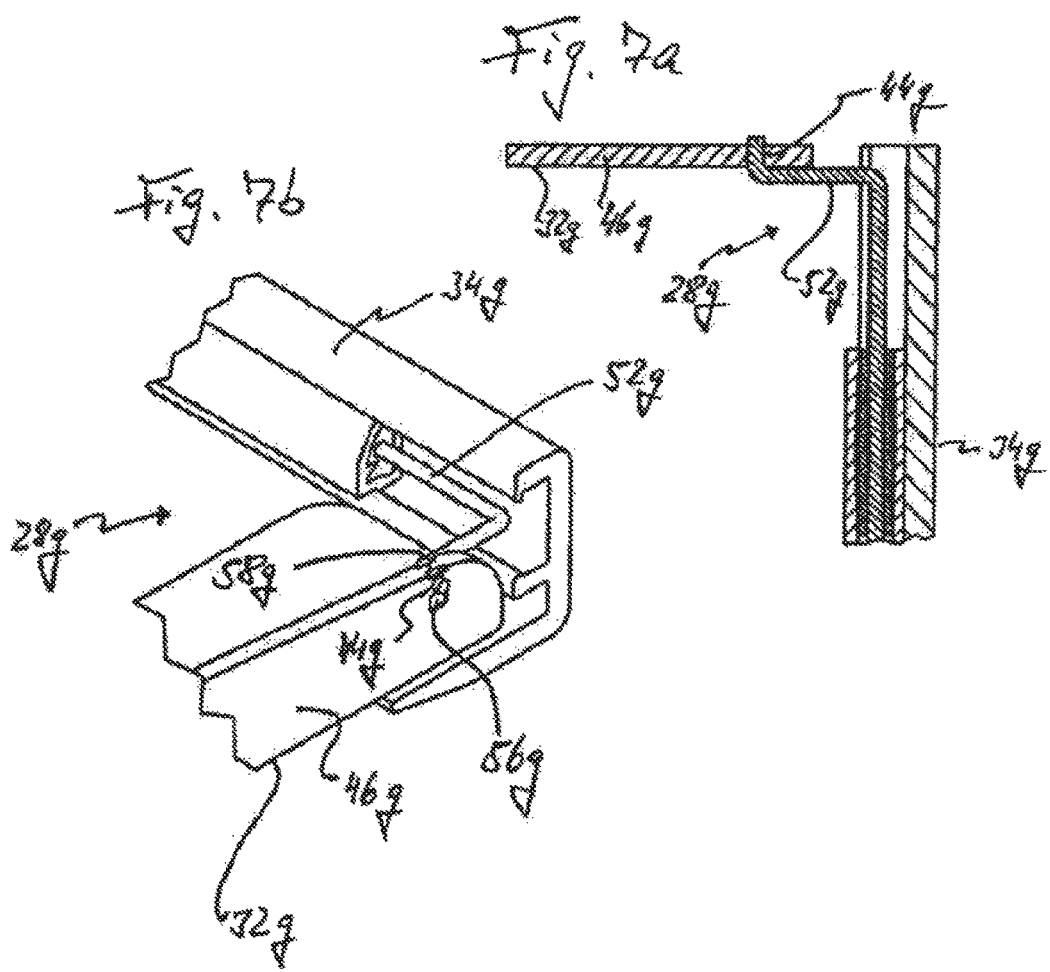

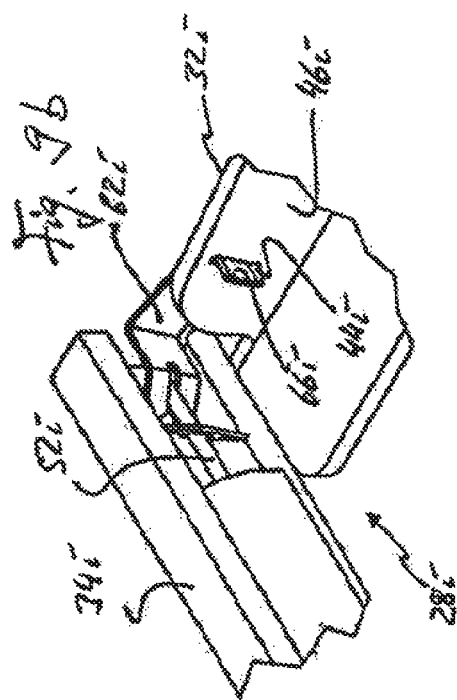
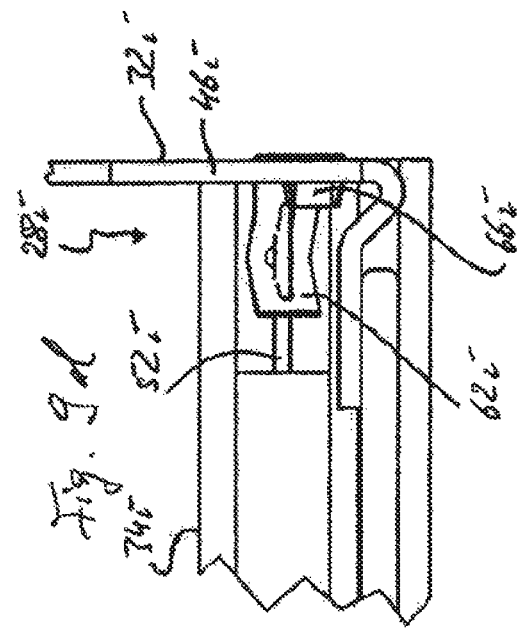
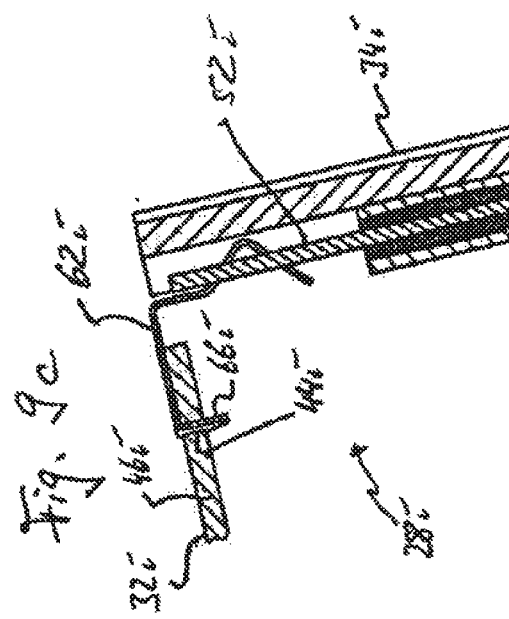
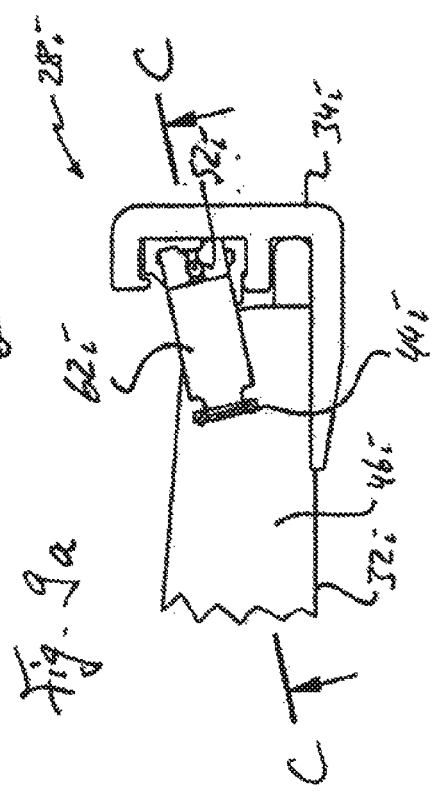

SHELF ASSEMBLY FOR A REFRIGERATOR OR FREEZER

BACKGROUND OF THE INVENTION

1. Field of the Invention

The present invention relates generally to a shelf assembly for a refrigerator or freezer.

2. Description of the Prior Art

With regard to the prior art relating to shelf assemblies, reference is made by way of example to US 2014/0376213 A1, US 2014/0217879 A1, U.S. Pat. No. 8,322,873 B2, U.S. Pat. No. 8,899,704 B2 and U.S. Pat. No. 8,596,205 B2.

SUMMARY OF THE INVENTION

A shelf assembly according to embodiments of the present disclosure includes a receiving plate for receiving objects, a holding arrangement which is joined to the receiving plate to form a structural unit, and one or more electrical consumers, for example a lighting module by means of which light can be produced, which can serve, for example, to illuminate the receiving plate or/and an interior of the refrigerator or freezer. Other electrical consumers include, for example, a fan, a camera or/and a sensor (for example temperature sensor). Such a shelf assembly can be mounted in the interior of the refrigerator or freezer by means of the holding arrangement, whereby the vertical position is frequently selectable, that is to say the user can choose between different vertical positions for the shelf assembly in the interior. The shelf assembly can be inserted into and removed from the interior as such, that is to say as an assembly including the receiving plate, the holding arrangement and the at least one electrical consumer.

The holding arrangement comprises at least one holding element which is arranged in the region of a side edge of the receiving plate, extends along the side edge and is made at least in part of an electrically conducting metal material. Side edge here refers to a plate edge which, as seen from the perspective of a user who is standing in front of the refrigerator or freezer and looking into the interior of the appliance, extends on the right- or left-hand side of the receiving plate. When viewed in this manner, the two side edges (that is to say on the right and left) are supplemented by a front plate edge which is close to the user and a rear plate edge which is remote from the user.

The electrically conducting metal material of the holding element can be used for power conduction, in order to supply electrical energy to the at least one electrical consumer of the shelf assembly via the holding element. The possibility of using a metallic holding element of a shelf assembly for power conduction is referred to, for example, in US 2014/0376213 A1. For contacting the holding element with an adjacent electrical conductor in the power supply circuit, it is proposed therein locally to remove an insulating coating of the holding element and establish electrical contacting in the metallic surface regions so exposed, see, for example, paragraphs [0024] and [0035] of US 2014/0376213 A1.

By contrast, embodiments of the present disclosure provide that an electrically conducting element projects into a cutout in the holding element and is there in electrically conducting contact with the holding element. There are many different possible ways of establishing the electrically conducting contact between the holding element and the electrically conducting element inside the cutout. According to one embodiment, the electrically conducting element is a bolt member inserted into the cutout with a bolt head protruding from the cutout, whereby the electrically conducting contact can in this case be produced between an inside wall of the cutout and a portion of an outer peripheral surface of the bolt member that is situated inside the cutout. A further electrically conducting element lying in the power supply path can then rest on the bolt head outside the cutout, if desired under spring tension, or it can be clamped between the holding element and the bolt head. The bolt member can be a rivet or a screw, for example.

According to another embodiment, the electrically conducting element is held in the cutout by squeezing engagement. The electrically conducting element can, for example, be squeezed between opposing portions of an inside wall of the cutout or it can be squeezed between the inside wall of the cutout and a bolt member, in particular an electrically conducting bolt member, inserted into the cutout. The bolt member can in turn be a rivet or a screw, for example.

In certain embodiments, the electrically conducting element is a wire member. The wire member can extend through the cutout and be shaped into a rivet head in the region of an end portion protruding from the cutout. Alternatively or in addition, such a wire member can be squeezed in the cutout of the holding element in order to establish an electrically conducting contact between the metal material of the holding element and the wire member.

In certain embodiments, the electrically conducting element is under inherent spring tension, whereby it is urged by the inherent spring tension in contact with an inside wall of the cutout. A form of the electrically conducting element which is suitable for generating sufficient inherent spring tension is, for example, that of an angled sheet-metal part which projects into the cutout with a protruding tongue.

The cutout can be in the form of a blind hole or through-hole of circular cross-section. In other embodiments, on the other hand, the cutout is in slot form.

There are suitable for the metal material of the holding element aluminum, iron or steel, for example. The steel can be unalloyed or low-alloy. A steel is conventionally referred to as low-alloy steel when none of its alloying components is present in an amount by weight of 5% or more. It is not necessary to use a high-alloy steel for the holding element in at least certain embodiments of the present invention. In some embodiments, the metal material of the holding element is free of a high-allow steel.

The electrical consumer is mounted, for example, in the region of a front edge of the receiving plate. In this case (but not only in this case), the electrically conducting element can lie in the power supply path between the holding element and the consumer. However, it is entirely possible within the scope of the invention to use the contacting technique disclosed herein for an electrically conducting element that lies in the power supply path of the at least one electrical consumer between the holding element and an electrical power feed point arranged on an interior-delimiting wall of the refrigerator or freezer.

The present invention further provides a method for producing a shelf assembly for a refrigerator or freezer. The method includes providing a pre-product for a holding element made at least in part of an electrically conducting metal material, processing the pre-product to produce the holding element, the processing including a step of drilling or punching to form a cutout in the pre-product, providing a receiving plate for receiving objects, providing a holding arrangement by means of which the shelf assembly can be mounted in a cooling or freezing space of the refrigerator or freezer on delimiting walls of the cooling or freezing space, where the holding arrangement includes the holding element, joining the holding arrangement to the receiving plate to form a structural unit in which the holding element is arranged in the region of a side edge of the receiving plate, and establishing a power supply path to an electrical consumer, the power supply path extending via the metal material of the holding element and an electrically conducting element, where establishing the power supply path includes mounting the electrically conducting element such that the electrically conducting element projects into the cutout of the holding element and is there in electrically conducting contact with the holding element.

Thus, and in accordance with this method, the cutout is formed by drilling or punching a pre-product of the holding element. In certain embodiments, the pre-product comprises a metal core which is formed, for example, of a sheet-metal material, as well as a coating or casing of an electrically insulating material, where the cutout is formed by drilling or punching through the coating or casing into the metal core and, if desired, through the metal core. Such a drilling or punching operation can be carried out with a comparatively low outlay. The described procedure is therefore suitable for inexpensive production within the context of mass production.

The coating or casing of the metal core includes, for example, anodic coating, powder coating or polymer embedding of the metal core. In the case of an aluminum core of the holding element, the anodic coating can be produced by anodization. The powder coating can be produced, for example, in the case of an iron or steel core in a powder coating method. Polymer embedding can be achieved, for example, by injecting a plastics material around the metal core.

The invention will be explained further hereinbelow by means of the accompanying drawings.

BRIEF DESCRIPTION OF THE DRAWINGS

FIG. 1 is a perspective view of a refrigerator or freezer according to one embodiment showing the door of the appliance open.

FIG. 2 is a perspective view of a portion of a shelf assembly for the refrigerator or freezer of FIG. 1 according to one embodiment.

FIG. 3 is a perspective view of a portion of a shelf assembly according to a variant of the embodiment of FIG. 2.

FIGS. 4*a*, 4*b* show two variants of a first embodiment of the electrical contacting of a holding element of a shelf assembly for a refrigerator or freezer.

FIG. 5 shows a second embodiment of the electrical contacting of a holding element of a shelf assembly for a refrigerator or freezer.

FIGS. 6*a*, 6*b* show a sectional view and a perspective view, respectively, of a third embodiment of the electrical contacting of a holding element of a shelf assembly for a refrigerator or freezer.

FIGS. 7*a*, 7*b* show a sectional view and a perspective view, respectively, of a fourth embodiment of the electrical contacting of a holding element of a shelf assembly of a refrigerator or freezer.

FIGS. 9*a* to 9*d* show different views of a sixth embodiment of the electrical contacting of a holding element of a shelf assembly of a refrigerator or freezer.

DETAILED DESCRIPTION OF THE EMBODIMENTS

Figure 8B:
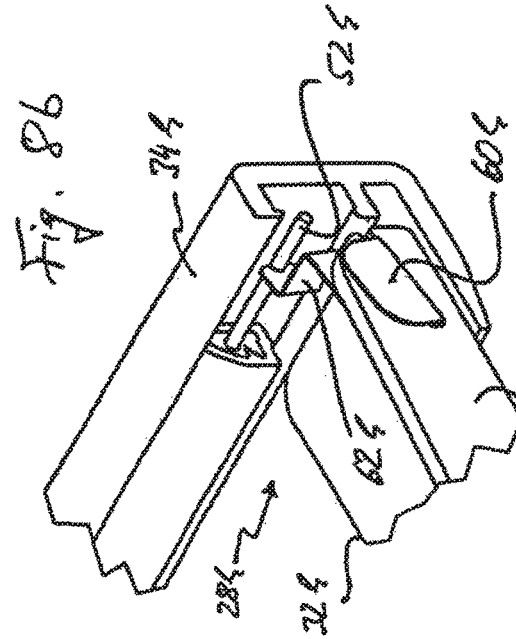
FIGS. 8*a* to 8*d* show different views of a fifth embodiment of the electrical contacting of a holding element of a shelf assembly of a refrigerator or freezer.

Reference will first be made to FIG. 1. The refrigerator or freezer shown therein is generally designated 10. It is a cabinet-style appliance which serves to store food in the cold or frozen state and has a cabinet body 12 with a bottom wall 14, a top wall 16, a rear wall 18 and two side walls 20. The cabinet body 12 forms an access opening 22 which is bordered by the bottom wall 14, the top wall 16 and the two side walls 20, which access opening can be closed by a cabinet door 24 which is articulated with one of the side walls 20 in such a manner that it is pivotable about a vertical pivot axis, and through which access opening an interior 26 of the refrigerator or freezer 10 is accessible for the user.

The interior 26 of the refrigerator 10 can be or is capable of being equipped with a wide variety of built-in components which are suitable for receiving and holding food. At least one of these built-in components is a shelf assembly 28, which has as the central component a receiving plate 30 which serves as a shelf and can be made of a transparent material, for example glass or plastics material. The receiving plate 30 has a rectangular shape with side edges (adjacent to the side walls 20), a rear edge (adjacent to the rear wall 18) and a front edge (opposite the rear plate edge). The shelf assembly 28 further comprises two holding elements 32, each of which is arranged in the region of one of the side edges of the receiving plate 30 and of which only one is shown in FIG. 1 by a broken line. The two holding elements 32 each extend in the longitudinal direction of the respective side edge of the receiving plate 30 and allow the shelf assembly 28 to be mounted or hooked onto suitable holding structures (not shown) which are provided on the side walls 20 or/and the rear wall 18 of the cabinet body 12, in order thus to fit the shelf assembly 28 in the interior 26. The mentioned holding structures on the walls 18 or/and 20 of the cabinet body 12 can include, for example, one or more mounting pins, one or more slide-in rails, one or more openings for insertion of a holding hook or the like, as is known per se in the relevant technical field. The holding elements 32 can extend substantially over the entire length of the side edges of the receiving plate 30 or, in other forms, can be shorter, in some cases even substantially shorter, than the side edges of the receiving plate 30.

In the region of the front edge of the receiving plate 30, the shelf assembly 28 additionally has an elongate lighting module 34 in strip form, which extends substantially over the entire width of the receiving plate 30 (that is to say extends from one of the side walls 20 to the opposite side wall 20). The function of the lighting module 34 is to illuminate the receiving plate 30 or/and regions of the interior 26 that are above or/and below the receiving plate 30. To that end, the lighting module 34 contains, for example, a plurality of light sources (for example light-emitting diodes) which are arranged one behind the other in the longitudinal direction of the strip (corresponding to a direction from one of the side walls 20 to the opposite side wall 20) and the light of which is, for example, in part coupled into the front narrow side of the receiving plate 30 and in part guided past the receiving plate 30 into the region of the interior 26 that is beneath the receiving plate 30. For details relating to a configuration of the lighting module 34, reference is made to German patent application no. 10 2015

007 839.9, the content of which is incorporated herein by reference. It will be appreciated that the lighting module 34 is here merely representative of any desired electrical consumer as part of the shelf assembly 28.

The lighting module 34 can be fixed to the receiving plate 30. Alternatively, the lighting module 34 can be fixed to the holding elements 32. In any case, the shelf assembly 28 (having the components receiving plate 30, holding elements 32 and lighting module 34) can be inserted as a unit into the interior 26 of the refrigerator or freezer 10 and removed therefrom again.

In the example shown, the refrigerator or freezer 10 contains at least one further shelf 36 which, like the receiving plate 30, serves to receive food. Although this is not shown in FIG. 1, the shelf 36 can be part of a shelf assembly which has the same configuration as the shelf assembly 28.

For the explanation of structural details of the shelf assembly 28, reference will next be made to FIGS. 2 and 3. These two figures show two variants for producing a connection between the receiving plate and one of the holding elements of the shelf assembly. In both figures, components which are the same or have the same effect are provided with the same reference numerals as in FIG. 1 but, in order to distinguish between the two variants, a lowercase letter is added in each case. Unless indicated otherwise hereinbelow, the components which are the same or have the same effect will be explained by reference to the above observations in connection with FIG. 1.

FIG. 2 shows a perspective view obliquely from behind of the shelf assembly 28a, that is to say the view is of the rear narrow side of the receiving plate 30a and of a rear side of the holding element 32a remote from the rear wall 18 of the refrigerator or freezer 10 of FIG. 1. The same applies for FIG. 3.

In the variant according to FIG. 2, the shelf assembly 28a comprises a connecting strip 38a which is in the form of a profile part and has two insertion slots 40a, 42a. One of the insertion slots—here the insertion slot 40a—allows the receiving plate 30a to be pushed, with one of its side edges leading, into the insertion slot in question. The other insertion slot—here the insertion slot 42a—similarly allows an edge portion of the holding element 32a to be inserted. The two insertion slots 40a, 42a—when viewed in a cross-section to the longitudinal direction of the connecting strip 38a—are oriented substantially at a right angle to one another. They have an opening width which is slightly smaller than the thickness of the region of the receiving plate 30a or of the holding element 32a that is to be pushed into the respective insertion slot, so that the two opposing slot jaws of the insertion slot are pushed apart slightly upon insertion into the insertion slot and the connecting strip 38 can therefore hold the receiving plate 30a and the holding element 32a with pressure. An additional adhesive for adhesively bonding the receiving plate 30a or/and the holding element 32a in the insertion slot 40a or the insertion slot 42a is not necessary, although the use of such an adhesive is of course not excluded. The connecting strip 38a is made of plastics material, for example, but can alternatively consist of a metal, for example aluminum.

In the variant according to FIG. 3, the shelf assembly 28b comprises a connecting strip 38b which is likewise in the form of a profile part but, in contrast to the connecting strip 38a of FIG. 2, forms only one insertion slot 40b which serves for insertion of the receiving plate 30b. The connection between the profile strip 38b and the holding element 32b is produced, for example, by adhesive bonding, welding or soldering between the two components (without a push fit). The connecting strip 38b is consequently not detachable from the holding element 32b when the shelf assembly 28b is in the finished state.

In the case of the further figures too, components therein which are the same or have the same effect are in each case provided with the same reference numerals, again with the addition of a lowercase letter. Unless indicated otherwise hereinbelow, reference is made to the above observations for the explanation of these components. In particular, the embodiments shown in the following figures can optionally be combined with each of the two mounting variants shown in FIGS. 2 and 3.

The embodiments shown in FIGS. 4a to 9d assume that at least one of the two holding elements 32 of the shelf assembly 28 according to FIG. 1 consists of an electrically conducting metal material or in any case comprises such a metal material, and that this metal material is used to conduct electric power via the holding element 32 in question to the lighting module 34. In order to be able to conduct electric power, the holding modules 32 have, for example, a metal core made of aluminum, iron or steel, which is enclosed by an electrically insulating coating or casing. In order to establish an electrical contact with the holding element 32 in question, the coating or casing, which is formed, for example, by a powder coating or an anodic layer, must therefore be penetrated. To that end, at least one cutout is provided in the holding element in question, which cutout is introduced by drilling or punching into a pre-product—already provided with the coating or casing—of the finished holding element 32 and at the inside wall of which contact is established with an electrically conducting element which protrudes from the cutout. It will be appreciated that the cutout is introduced into the holding element 32 in question at the point at which the metal core is present and is consequently freely accessible on the inside wall of the cutout of the metal material of the holding element 32. Various embodiments for carrying out electrical contacting of the holding element 32 in this manner are shown in FIGS. 4a to 9d.

In the embodiment according to FIG. 4a, the holding element 32c has a cutout 44c in the form of a through-hole with a circular cross-section, which is provided in a wall portion 46c of the holding element 32c and passes through the entire wall thickness of the wall portion 46c. A rivet 48c is inserted into the cutout 44c, which rivet is likewise made of an electrically conducting material, for example copper, nickel, zinc, iron or an alloy with one or more of those materials, and has rivet heads 50c. The rivet heads 50c are situated outside the cutout 44c; inside the cutout 44c there is electrical contact between the outer peripheral surface of the rivet 48c and the inner peripheral surface of the cutout 44c.

A further electrical conductor 52c protrudes from the lighting module 34c and rests on or against one of the rivet heads 50c of the rivet 48c and thereby establishes an electrical connection to the rivet 48c and thus to the holding element 32c. In order to ensure permanently reliable contact between the conductor 52c and the rivet 48c, the conductor 52c should rest on the rivet 48c under the action of force. This can be achieved in that the conductor 52c is formed of an angle piece made of sheet metal which, in the finished mounted state of the shelf assembly 28c, presses against the rivet 48c under inherent spring tension. In FIG. 4a, 52*c indicates by a broken line the form of the conductor 52c before fitting into the shelf assembly 28c. When the shelf assembly 28c is fitted together, the conductor 52c is bent resiliently, whereby the inherent spring tension required for the desired reliable electrical contact is produced.

Instead of the rivet 48c it is also possible, for example, to use a screw (for example a self-tapping screw made of zinc) which is screwed into the cutout 44c and is contacted by the conductor 52c at its screw head.

In the example of FIG. 4a, the conductor 52c rests on one of the two rivet heads 50c that is closer to the receiving plate 30c. The reverse situation is of course also conceivable, in which the conductor 52c rests on one of the rivet heads 50c that is remote from the receiving plate 30c. This situation is shown in FIG. 4b. In the variant according to FIG. 4b, the conductor 52d extends outside the wall portion 46d (seen from the receiving plate 30d), not inside it as in the variant according to FIG. 4a.

In the embodiment according to FIG. 5, direct electrical contact between the holding element 32e and the conductor 52e is established in that a free end of the conductor 52e extends into the cutout 44e, where it is clamped between the rivet 48e and the inner peripheral surface of the cutout 44e. The conductor 52e is in this case formed, for example, by a flexible wire, the end portion of which that extends into the cutout 44e is freed of wire insulation.

In the embodiment according to FIGS. 6a, 6b, the conductor 52f is formed by a flexible or rigid wire member which is inserted with an end portion into the cutout 44f, a portion of the wire member 52f protruding from the cutout 44f being formed into a rivet head 54f. The wire member 52f can already have the rivet head 54f when it is supplied for assembly of the individual components of the shelf assembly 28f. Alternatively, the rivet head 54f can be produced by means of a riveter by plastic deformation of the wire member 52f once the wire member 52f has been pushed through the cutout 44f.

In the embodiment according to FIGS. 7a, 7b, the conductor 52g is again formed by a flexible or rigid wire member of circular cross-section which is inserted into the cutout 44g and—in the example shown—extends through the cutout 44g. For fixing the end portion of the wire member 52g situated in the cutout 44g, the cutout 44g is made narrower by squeezing. For example, the portion of the holding element 32g containing the cutout 44g can be squeezed from two opposite sides of the cutout 44g by means of pincers or another tool. To that end, FIG. 7b shows by way of example an opening 56g in the holding element 32g. One squeezing jaw of the mentioned squeezing tool can be introduced into the opening 56g, while the other squeezing jaw engages the holding element 32g on the opposite side of the cutout 44g (at 58g in FIG. 7b).

Figure 8D:
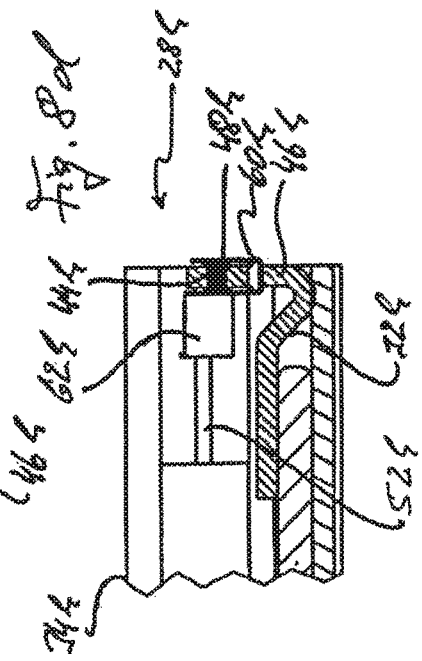
Figure 8C:
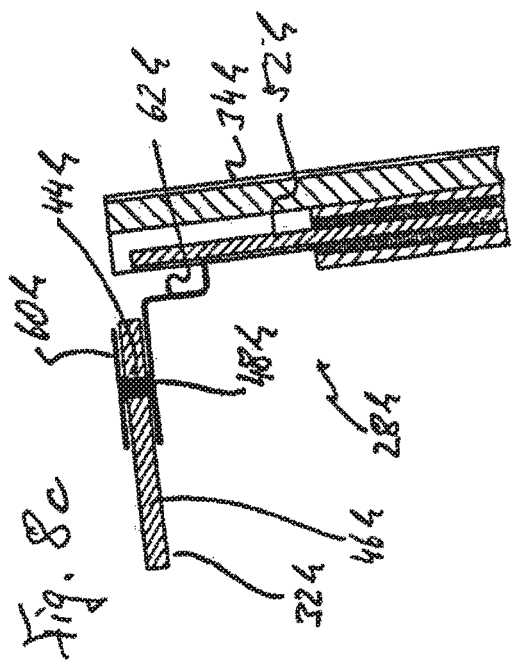
Figure 8A:
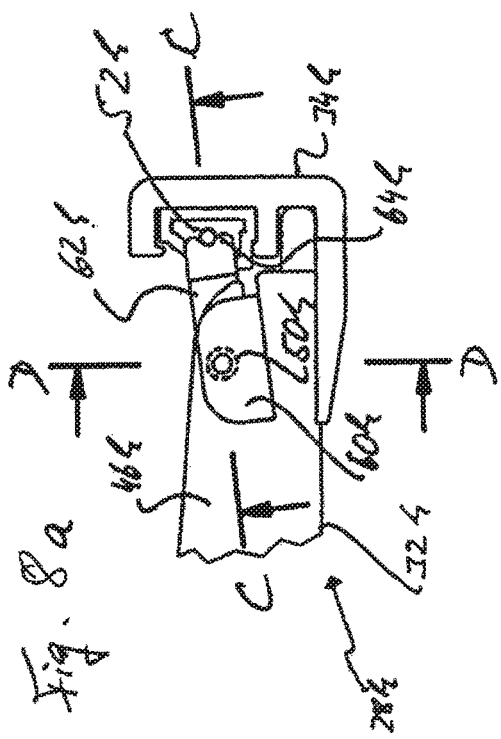

Reference will now be made to the embodiment according to FIGS. 8a to 8d. Of those figures, FIG. 8c represents a section along a line C-C in FIG. 8a, while FIG. 8d represents a section along a line D-D in FIG. 8a.

In the embodiment according to FIGS. 8a to 8d—similarly to the embodiments of FIGS. 4a, 4b—the electrical contacting of the holding element 32h is effected by a rivet 48h which is inserted into the cutout 44h of the holding element 32h. An electrically conducting intermediate member 62h is in the form of a bent sheet-metal part (for example galvanized, silver-coated or made of copper) and has a portion 60h which is bent in a U-shape and is fitted to a portion of the wall portion 46h in such a manner that the two lateral legs of the U-shaped portion 60h are in contact with the rivet 48h at its two rivet heads 50h. This can clearly be seen in FIGS. 8c, 8d. Towards the lighting module 34h, the intermediate member 62h is in power-transmitting contact with a rod-shaped conductor element 52h protruding from the lighting module 34. In the example shown, this is formed by means of a notch 64h (FIG. 8a) in the intermediate member 62h, into which the conductor element 52h engages. Advantageously, the intermediate member 62h presses against the conductor element 52h under inherent spring tension in order to achieve good electrical contact. Alternatively or in addition, the intermediate member 62h can be permanently connected to the conductor element 52h, for example by soldering or by a crimp connection.

Reference will now be made to the embodiment according to FIGS. 9a to 9d. In those figures, FIG. 9c represents a sectional view along a cutting line C-C in FIG. 9a.

In contrast to the embodiments shown hereinbefore, the cutout 44i in the embodiment according to FIGS. 9a to 9d is not in the form of a circular through-hole but in the form of a slot which passes through the wall portion 46i of the holding element 32i. Into the slot 44i there is inserted an end tongue 66i of an electrically conducting angle member 62i made of sheet metal, which in turn is in power-transmitting contact with a rod-like conductor element 52i of the lighting module 34i. When the shelf assembly 28i is in the finished mounted state, the angle member 62i is bent in the resilient region so that it is under inherent spring tension, ensuring good mechanical and thus electrical contact both at the transition to the holding element 32i and at the transition to the conductor element 52i.

At least in some of the embodiments presented herein it is possible that the metal surface inside the cutout that is exposed after the cutout has been produced in the holding element is closed or covered substantially completely relative to the external environment by the subsequent engagement of an electrically conducting element. For this reason it is possible to use, for example, iron (instead of a high-alloy stainless steel) as the metal material of the holding element without the risk of corrosion of the iron material.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A shelf assembly for a refrigerator or freezer, comprising:
   a receiving plate for receiving objects;
   a holding arrangement which is joined to the receiving plate to form a structural unit and by means of which the shelf assembly can be mounted in a cooling or freezing space of the refrigerator or freezer on delimiting walls of the cooling or freezing space, wherein the holding arrangement includes at least one holding element which is arranged in the region of a side edge of the receiving plate, extends along the side edge and is made at least in part of an electrically conducting metal material; and
   an electrical consumer, wherein the shelf assembly forms a power supply path extending via the metal material of the holding element for supplying power to the electrical consumer,
   wherein an electrically conducting element lies in the power supply path, which electrically conducting element projects into a cutout in the holding element and is there in electrically conducting contact with the holding element.

2. The shelf assembly according to claim 1, wherein the electrically conducting element is a bolt member which is inserted into the cutout and has a bolt head protruding from the cutout, wherein a further electrically conducting element lying in the power supply path rests on the bolt head or is clamped between the holding element and the bolt head.

3. The shelf assembly according to claim 2, wherein the further electrically conducting element rests on the bolt head under spring tension.

4. The shelf assembly according to claim 2, wherein the bolt member is a rivet or a screw.

5. The shelf assembly according to claim 1, wherein the electrically conducting element is held in the cutout by squeezing engagement.

6. The shelf assembly according to claim 5, wherein the electrically conducting element is squeezed between opposing portions of an inside wall of the cutout or is squeezed between the inside wall of the cutout and a bolt member.

7. The shelf assembly according to claim 1, wherein the electrically conducting element is a wire member, wherein the wire member extends through the cutout and is shaped into a rivet head in the region of an end portion protruding from the cutout.

8. The shelf assembly according to claim 1, wherein the electrically conducting element is under inherent spring tension and is urged by the inherent spring tension in contact with an inside wall of the cutout.

9. The shelf assembly according to claim 8, wherein the electrically conducting element is an angled sheet-metal part which projects into the cutout with a protruding tongue.

10. The shelf assembly according to claim 1, wherein the cutout is in the form of a blind hole or through-hole of circular cross-section or is in slot form.

11. The shelf assembly according to claim 1, wherein the metal material of the holding element is aluminum, iron or steel.

12. The shelf assembly according to claim 11 wherein the steel is a low-alloy steel.

13. The shelf assembly according to claim 1, wherein the metal material of the holding element is free of a high-alloy steel.

14. The shelf assembly according to claim 1, wherein the consumer is mounted in the region of a front edge of the receiving plate and the electrically conducting element lies in the power supply path between the holding element and the consumer.

15. The shelf assembly according to claim 1, wherein the holding arrangement comprises a connecting strip in association with the holding element, wherein the connecting strip has an insertion slot into which the receiving plate is inserted with a side edge portion.

16. The shelf assembly according to claim 15 wherein the connecting strip has a further insertion slot into which the holding element is inserted.

17. A method for producing a shelf assembly for a refrigerator or freezer, the method comprising:
providing a pre-product for a holding element made at least in part of an electrically conducting metal material;
processing the pre-product to produce the holding element, the processing including a step of drilling or punching to form a cutout in the pre-product;
providing a receiving plate for receiving objects;
providing a holding arrangement by means of which the shelf assembly can be mounted in a cooling or freezing space of the refrigerator or freezer on delimiting walls of the cooling or freezing space, wherein the holding arrangement includes the holding element;
joining the holding arrangement to the receiving plate to form a structural unit in which the holding element is arranged in the region of a side edge of the receiving plate; and
establishing a power supply path to an electrical consumer, the power supply path extending via the metal material of the holding element and an electrically conducting element, wherein establishing the power supply path includes mounting the electrically conducting element such that the electrically conducting element projects into the cutout of the holding element and is there in electrically conducting contact with the holding element.

18. The method according to claim 17, wherein the step of providing a pre-product includes providing a pre-product with a metal core and a coating or casing of an electrically insulating material.

19. The method according to claim 18, wherein the pre-product providing step includes anodic coating or casing the metal core, powder coating the metal core or polymer embedding the metal core.

* * * * *